United States Patent [19]

Medlin

[11] Patent Number: 4,963,820
[45] Date of Patent: Oct. 16, 1990

[54] ENERGY METER
[75] Inventor: Roger E. Medlin, Raleigh, N.C.
[73] Assignee: ABB Power T & D Company, Blue Bell, Pa.
[21] Appl. No.: 350,266
[22] Filed: May 11, 1989
[51] Int. Cl.⁵ .................. G01R 15/08; G01R 11/64
[52] U.S. Cl. .................................. 324/142; 324/115; 324/103 R; 324/116
[58] Field of Search ........... 524/142, 156, 157, 103 R, 524/141, 115; 364/483, 492; 340/657; 439/744, 745, 746; 374/181

[56] References Cited
U.S. PATENT DOCUMENTS

| | | | |
|---|---|---|---|
| 4,207,557 | 6/1980 | Gilkeson et al. | 324/142 |
| 4,386,816 | 6/1983 | Frear et al. | 439/744 |
| 4,537,516 | 8/1985 | Epstein | 374/181 |
| 4,571,692 | 2/1986 | Germer | 324/103 R |
| 4,627,000 | 12/1986 | Germer | 324/103 R |
| 4,665,358 | 5/1987 | Bullock et al. | 324/142 |
| 4,701,698 | 10/1987 | Karlsson et al. | 324/103 R |

Primary Examiner—Ernest F. Karlsen
Assistant Examiner—Vinh P. Nguyen
Attorney, Agent, or Firm—A. J. Rossi

[57] ABSTRACT

An energy meter composed of a meter chassis (2) having a transducer (4) connected to sense energy usage and to provide an output having a fixed relation to the sensed energy usage, a replaceable register (6) connectable to the transducer (4) for converting the output provided by the transducer (4) into a readable energy usage indication, a transducer identifying unit (18) secured to the chassis (2) and coded to identify the fixed relation between the transducer output and the sensed energy usage, and a transducer sensing unit (10) secured to the register (6) for coupling with the transducer identifying unit (18) when the register (6) is connected to the transducer (4).

9 Claims, 2 Drawing Sheets

ENERGY METER

BACKGROUND OF THE INVENTION

The invention relates to energy meters, and particularly energy meters having interchangeable registers.

Energy meters, such as utility power meters, include two basic components: a meter chassis having a transducer which senses energy usage and produces a signal proportional to the energy usage; and a register which converts the signal into a form for accumulation and display. The register must be matched to the transducer so that the readings produced by the register will be an accurate representation of the energy usage sensed by the transducer.

In recent years, meters having interchangeable registers have been developed in order to meet different metering requirements. For examples, different registers can be provided in modular form to provide demand information, time-of-use information and time-of-use/load profile information. In addition, the use of replaceable registers enables a faulty register to be replaced easily without requiring replacement of the entire meter.

The standard transducer used on most residential applications is an electro-mechanical device whose output component is a rotating disk. The disk output is calibrated such that one disk revolution represents a given quantity of energy, which is known as the watt-hour constant, Kh.

The rotating disk may be mechanically coupled, via gears, to a mechanical register which stores the number of revolutions of the disk and provides a visual indication thereof. The gearing between the disk and the register is normally designed to provide a direct readout in units of kilowatt-hours. If the register of such a meter must be replaced, the replacement register must have a gear ratio which corresponds to the Kh value of the meter.

There are also known electronic registers constructed to be coupled to transducers which produce an electrical signal in the form of an output pulse train indicative of energy usage. One transducer of this type includes a disk similar to that used in mechanical transducers but constructed to cooperate with an optical sensor to cause the optical sensor to produce, during each disk revolution, a plurality of pulses which are converted to electrical pulses. The number of pulses produced during each disk revolution, Pr, varies widely from one meter type to another, and is generally in the range of 2-16 pulses per revolution. The quantity of energy usage represented by each pulse constitutes the watt-hour constant of the meter (Kh) divided by the number of pulses per disk revolution (Pr) and is represented by the term $$K = \frac{Kh}{Pr}.$$

A replacement register for such a meter must be provided with the value of at least K associated with the meter transducer in order for the register to produce meaningful data.

Known electronic register modules include a memory, which may be constituted by a plurality of PROMs, provided to store data identifying the meter to which the register module is to be connected. Conventionally, this data is supplied to the register module by personnel using a computer which can be connected to the register module. This allows a single register module to be used in meters having different transducer constants. However, this procedure must be carried out by properly trained personnel and requires a certain amount of time and care.

SUMMARY OF THE INVENTION

It is a primary object of the present invention to assure that a replacement register is compatible with the transducer to which it is connected.

A more specific object of the invention is to eliminate the need for programming an electronic register at the time it is connected to a transducer.

Another specific object of the invention is to prevent the connection of an incompatible mechanical register to an electro-mechanical transducer.

The above and other objects are achieved, according to the invention, in an energy meter comprising a meter chassis having a transducer connected to sense energy usage and to provide an output having a fixed relation to the sensed energy usage, and a replaceable register connectable to the transducer for converting the output provided by the transducer into a readable energy usage indication, by the provision of: transducer identifying means secured to the chassis and coded to identify the fixed relation between the transducer output and the sensed energy usage; and transducer sensing means secured to the register for coupling with the transducer identifying means when the register is connected to the transducer.

According to one aspect of the invention, meter chassis for use with electronic registers are provided, preferably during manufacture, with additional circuitry, possibly provided on an auxiliary printed circuit board, having a memory which is configured, before installation of the meter in the field, to contain the meter specific information required by a register module to correctly convert the transducer output signal to energy consumption readings. Thus, the memory installed in the meter chassis eliminates the need to program the register module when it is installed in the field, i.e., after the meter chassis has been installed at a metering site.

According to a further aspect of the invention, the meter specific information can be provided by means of a coded connector installed in the meter chassis. This connector is coded in such a manner that when coupled to a receptacle provided on an electronic register module, the coding provides the register module with the needed meter specific information. This coding can be provided by giving the connector a plurality of individual contacts, for example along one edge of a printed circuit board, each contact being removable so that the pattern of the remaining contacts contains the meter specific information, which is then read by suitable logic circuitry in the register module.

The invention further contemplates a coupling arrangement for mechanical structures which assures that a meter chassis can receive only a mechanical register which is compatible with that meter.

DESCRIPTION OF THE PREFERRED EMBODIMENTS

Figure 1:
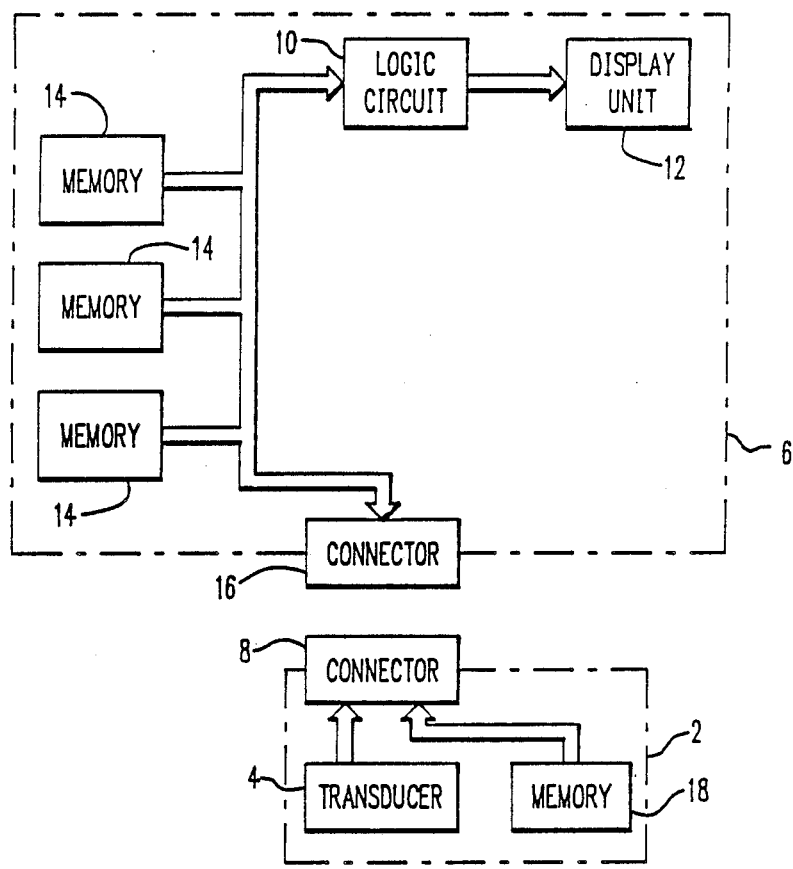
FIG. 1 is a block circuit diagram of the basic components of an energy meter provided with one preferred embodiment of the present invention.

FIG. 1 illustrates the basic components of an energy meter of the type having an electronic transducer, the meter including a meter chassis 2 containing an electronic transducer 4, and an interchangeable register 6. Meter chassis 2 further includes a connector 8 which is connected to transducer 4 via a bus. Register 6 includes, inter alia, a logic circuit 10 for converting energy signals provided by transducer 4 into a form suitable for display, and a display unit 12 connected to logic circuit 10 for receiving display signals and generating the resulting display. Register 6 can further be provided with devices which enable the readings obtained to be transmitted to a remote location.

Register 6 further includes a plurality of memories 14, some or all of which can be programmable with information designating the constants of transducer 4. According to the prior art, one or more of memories 14 would be programmed at the time the associated register 6 is connected to a particular meter chassis 2.

Logic circuit 10 and memories 14 are interconnected via a bus which is additionally connected to a connector 16 configured to be coupled with connector 8 when register 6 is connected to meter chassis 2.

According to the embodiment of the invention depicted in FIG. 1, meter chassis 2 is further provided with a memory 18, which may be a programmable read only memory which is programmed, during manufacture of meter chassis 2, to contain the data identifying the characteristics of transducer 4 and required by any electronic register 6 intended to be coupled to meter chassis 2. Memory 18 is connected to connector 8 via a bus. Alternativily, memory 18 could be connected to an additional connector which is arranged to be coupled with a further connector provided on register 6

During installation of register 6 on meter chassis 2, connectors 8 and 16 will be automatically coupled together. After register 6 has been coupled to meter chassis 2, logic circuit 10, which may be a microcomputer, transmits an address designating memory 18 over the meter chassis bus and memory 18 supplies the stored meter-specific data to logic circuit 10 so that logic circuit 10 will be automatically configured to produce energy readings which are based on the constants associated with transducer 4.

Although register 6 is configured to receive data in accordance with the present invention, it is preferably constructed to contain programmable memories 14, so that register 6 remains compatible with meters which have not been equipped with the additional memory 18. In this case if the address designating memory 18 does not produce a response, logic circuit 10 will assume a condition to accept data supplied by a programmer, by cable or optical transfer, and read in to appropriate ones of memories 14.

In further accordance with the invention, memory 18 can be programmed, during manufacture of meter chassis 2, to include meter nameplate and identification data so that a register 6 subsequently coupled to meter chassis 2 need only be programmed with information as to the billing rate for the particular meter installation and with certain information required for time-of-use and/or load profile applications.

The above-described embodiment of the invention also offers the possibility of constructing memory 18 to function as a backup KWH or KW demand register which can be read out via an optical port and register 6 in the event of failure of the memory in register 6

Figure 2:
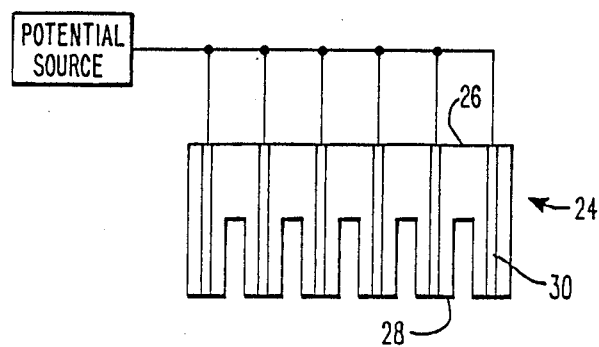
FIG. 2 is a pictorial view of an alternative transducer identifying device according to the invention for use with an electronic transducer.

According to a second embodiment of the invention, illustrated in FIG. 2, memory 18 can be replaced by a connector 24 composed of an insulating substrate 26 having, along one edge, a plurality of fingers 28 each carrying a conductive strip 30. Fingers 28 and their associated conductive strips 30 form an edge connector which will be coupled to a suitable connector provided on register 6 when register 6 is installed on meter chassis 2. Connector 24 is constructed so that each finger 28 can be individually broken off in a pattern representative of the constants associated with transducer 4. Then, when connector 24 is coupled to a mating connector on register 6, the pattern of remaining conductive strips 30 will constitute a code which supplies logic circuit 10 with information identifying the characteristics of transducer 4.

While FIG. 2 illustrates a connector having a small number of conductive strips 30, it will be appreciated that a connector having a substantially larger number of strips, and hence capable of providing a large variety of data, can be employed.

Each conductive strip 30 can be connected to a source of a selected potential or to ground to supply a suitable binary signal.

The above-described embodiments can be implemented by retro-fit kits allowing customers to upgrade existing meter chassis constructed for use with electronic registers.

Figure 3:
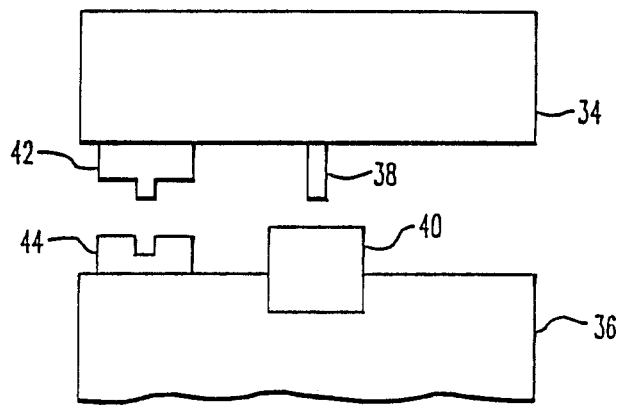
FIG. 3 is a simplified pictorial view of an embodiment of the invention secured to a meter having an electro-mechanical transducer and a mechanical register.

According to an other aspect of the invention, the coupling of an electro-mechanical transducer to an incompatible mechanical register is prevented by the provision of a suitable key structure. One such arrangement is shown in FIG. 3, which illustrates an electromechanical meter chassis 34 and a mechanical register 36 in position to be coupled with chassis 34. Chassis 34 contains a transducer disk (not shown) and an output shaft 38 which carries, and rotates with, the transducer disk. Register 36 includes a gear assembly 40 which will be connected with shaft 38 when register 36 is coupled to meter chassis 34. In accordance with the invention, chassis 34 is provided with an identification member 42 carrying one or more projections arranged in a pattern which is characteristic of the particular type of transducer employed in chassis 34. Correspondingly, register 36 carries an engagement member 44 having one or more recesses disposed to mate with the projections on member 42 only if register 36 is compatible with the transducer provided in meter chassis 34. Otherwise, register 36 cannot be coupled to chassis 34, so that installation of an incompatible register is reliably prevented.

In certain known meters, there is a universal bayonet mount for coupling the register to the meter chassis. Members 42 and 44 could advantageously be located on the parts of this mount.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. In an energy meter comprising a meter chassis having a transducer connected to sense energy usage and to provide an output having a fixed relation to the sensed energy usage, and a replaceable register connectable to the transducer for converting the output provided by the transducer into a readable energy usage indication, the improvement comprising: transducer identifying means secured to said chassis and coded to identify the fixed relation between the transducer output and the sensed energy usage; and transducer sensing means secured to said register for coupling with said transducer identifying means when said register is connected to said transducer.

2. A meter as defined in claim 1 wherein: said transducer identifying means provide electrical signals constituting a representation of the fixed relation between the transducer output and the sensed energy usage; said register is an electronic register; and said transducer sensing means comprise circuit means for receiving the electrical signals provided by said transducer identifying means to cause the readable indication to be a function of the fixed relation.

3. A meter as defined in claim 2 wherein said transducer identifying means comprise a memory containing a representation of the fixed relation.

4. A meter as defined in claim 2 wherein said register further comprises programmable memory means connected to be programmed to contain a representation of the fixed relation.

5. A meter as defined in claim 2 wherein said meter chassis further comprises means for storing a representation of the output provided by said transducer.

6. A meter as defined in claim 2 wherein: said transducer identifying means comprise a first connector having a plurality of contacts each connected to a source of a selected potential; each said contact is constructed to be selectively removable from said connector; and said register comprises a second connector matable with said first connector.

7. A meter as defined in claim 6 wherein said register further comprises programmable memory means connected to be programmed to contain a representation of the fixed relation.

8. A meter as defined in claim 1 wherein: said transducer comprises a rotatable disk having a shaft which rotates with said disk to provide the transducer output; said register is a mechanical register having gear means couplable to said shaft for converting the rotation of said shaft into the readable indication; said transducer identifying means comprise a first member having a structure representative of said transducer; and said transducer sensing means comprise a second member configured to mate with said first member if said register is compatible with said transducer.

9. A meter as defined in claim 8 wherein said first and second members are constructed for permitting said register to be connected to said transducer only if said second member mates with said first member.

* * * * *